May 16, 1950 C. F. WEILAND 2,507,582

BANDSPREAD TUNING CIRCUIT

Filed June 1, 1949 2 Sheets-Sheet 1

INVENTOR.

Christian F. Weiland

BY Robert S. Dunham

ATTORNEY

May 16, 1950 C. F. WEILAND 2,507,582

BANDSPREAD TUNING CIRCUIT

Filed June 1, 1949 2 Sheets-Sheet 2

INVENTOR.
Christian F. Weiland
BY Robert S. Dunham
ATTORNEY

Patented May 16, 1950

2,507,582

UNITED STATES PATENT OFFICE 2,507,582

BAND SPREAD TUNING CIRCUIT

Christian F. Weiland, New York, N. Y.

Application June 1, 1949, Serial No. 96,523

6 Claims. (Cl. 250—40)

This invention relates to a resonant circuit type tuning unit for oscillators and like electrical apparatus and particularly to an improved bandspread tuning unit for audio oscillators.

This invention may generally be described as an improved bandspread tuning unit made up of a plurality of particularly arranged circuit elements, whose values bear a predetermined relationship to each other, so that an enlarged, uncrowded, accurate decade type tuning scale made up of a plurality of subscales may be utilized for directly indicating the oscillating frequency range.

An object of this invention is to provide an improved bandspread tuning unit for audio oscillators.

Another object of this invention is to provide an improved bandspread tuning unit utilizing an enlarged, accurate, decade type tuning scale.

A further object of this invention is to provide an improved bandspread tuning unit which provides increased precision in calibration and in reading of the scale.

Still another object of the invention is to provide an improved bandspread tuning unit having a decade type tuning scale made up of three enlarged subscales having a fixed relationship for the oscillating or the tuning frequency range.

Another and further object of the invention is to provide an improved bandspread tuning unit having an enlarged decade type tuning scale made up of three subscales having a fixed relationship, so that one of the subscales will be sufficient to cover the decade range through the use of a convenient multiplier or divider.

Referring to the drawings.

Figures 1, 2:
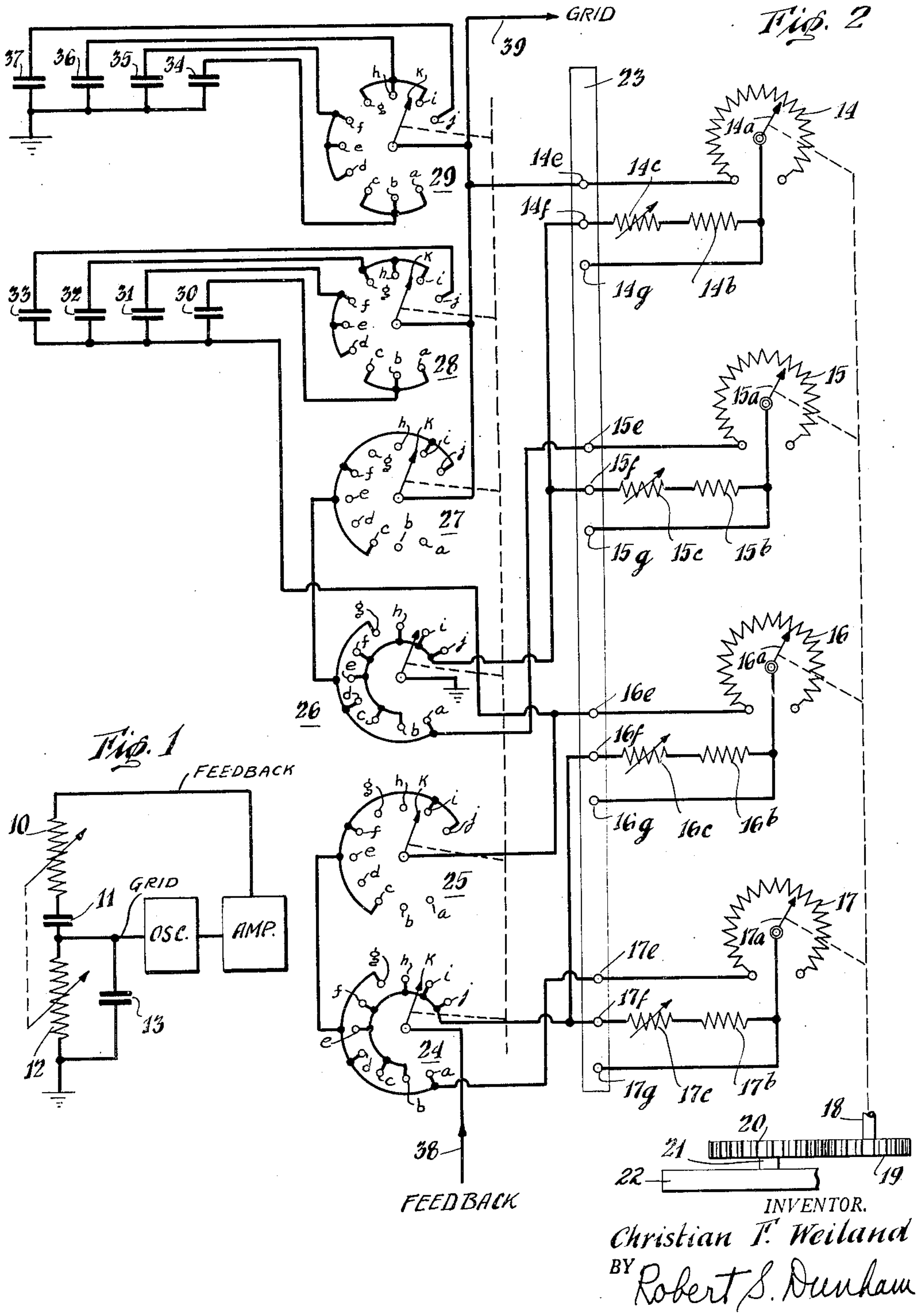
Fig. 1 is a schematic representation of a conventional tuning unit for a Wien bridge oscillator or conventional R.-C. audio oscillator.
Fig. 2 is a schematic circuit diagram of the improved bandspread tuning unit.

Fig. 1 illustrates schematically the basic tuning circuit of the conventional Wien bridge or R.-C. audio oscillator. The tunable impedances include resistors 10 and 12 connected in series between the amplifier feed-back circuit and ground. A fixed impedance, the capacitor 11, is included in the series circuit intermediate the resistors 10 and 12. The resistor 12 is paralleled by another fixed impedance, such as condenser 13. In Fig. 1 the resistors 10 and 12 are shown to be variable. However, in some embodiments the condensers 11 and 13 may be variable in lieu of the resistors. The condensers 11 and 13 and the resistors 10 and 12 should be equal in their respective capacity or resistance values.

The output of the tuning network is fed to the grid of an oscillator tube schematically represented together with an amplifier and conventional power supply in Fig. 1.

In the conventional circuit, as illustrated in Fig. 1, it is the usual practice to have a certain portion of the resistors 10 and 12, or of the capacitors 11 and 13, if they are the variable members, fixed so as to have a common tuning scale. This tuning scale may, for example, cover 15 to 150, 150 to 1500, and 1500 to 15,000 cycles per second. If such a scale is marked from 15 to 150, it is, of course, necessary to apply multipliers of 10, 100 and 1000 to cover an audio frequency spectrum from 15 to 15,000 cycles per second.

The conventional audio oscillators have a large range of frequencies spread over each one of these scales and, unless special precautions are taken, such as, for example, using specially tapered variable tuning resistors, or tuning condensers with specially shaped rotor blades, excessive crowding may be expected at the ends of the scales. This crowding makes accurate reading within reasonable tolerances extremely difficult. Precision tuning usually requires careful calibration.

Fig. 2 is a schematic representation of the complete improved bandspread tuning unit as applied to an audio oscillator of the type as specified in Fig. 1. In the presently preferred embodiment of the invention, as illustrated in Fig. 2, variable resistances are utilized. However, variable capacitors could also be utilized within the scope of the invention.

The tuning is accomplished by two tuning impedance circuits each comprising a pair of variable impedance elements such as, variable resistors of the potentiometer type. These potentiometers 14, 15, 16 and 17 are constructed so as to have the same resistance values and the same angle of rotation required in turning the movable arms 14*a*, 15*a*, 16*a* and 17*a* from their furthermost clockwise position to the furthermost counterclockwise position corresponding to ascending frequency tuning in the case of resistance tuning. Potentiometers 14 and 15 form a pair, as do potentiometers 16 and 17. Each of these pairs is instrumental in tuning its respective circuit.

As shown in the drawings, the potentiometers 14, 15, 16 and 17 are ganged together on a single shaft 18. If desired, however, the potentiometers could be coupled in pairs, i. e., 14 and 15, 16 and 17, each with their own shaft and gearing arrangement. Rigidly mounted at one end of the shaft 18 is a gear 19. The gear 19 is engaged and driven by a gear 20, which is mounted on a separate shaft 21. The shaft 21 is manually rotated by an external tuning dial 22. Rotating the tuning dial 22 rotates the gear 20, which in turn counter-rotates the gear 19 and the shaft 18.

In the presently preferred embodiment of the invention, as illustrated in Fig. 2, the potentiometers utilized are such that the potentiometer arms 14a, 15a, 16a and 17a may be rotated through an angle of approximately 300 degrees. If the tuning dial 22, for example, is of a conventional commercial type having a rotation of 180 degrees, and for tuning purposes only 270 degrees of the possible 300-degree rotation of the potentiometer arms 14a through 17a are used, a gear ratio of three to two is needed between gears 19 and 20.

It is desirable in utilizing potentiometers, such as 14 through 17, that a convenient percentage, such as, for example, ten per cent, of the total potentiometer resistance value not be used for variable tuning. Consequently, if potentiometers with a 300-degree swing are utilized, it follows, in the example stated, that 30 degrees of this swing will not be used for tuning. If the total resistance of each of the potentiometers 14 through 17 is 20,000 ohms, assuming the potentiometers to have linear characteristics, it is evident that only 90 per cent of the total resistance, or 18,000 ohms, will be used for actual variable tuning. The gearing may then be so arranged that the potentiometer arms 14a through 17a will, in the extreme counter-clockwise rotative position, be spaced 15 degrees from the extreme counter-clockwise terminal of the potentiometers 14 through 17. The portion not traversed by the potentiometer arms 14a through 17a at the extreme counter-clockwise portion appears as a fixed resistance in each of the tuning circuits. When the gearing is thus arranged, the arms 14a through 17a also will, in the extreme clockwise rotative position, be spaced 15 degrees from the extreme clockwise terminal. This remaining unused resistance at the extreme clockwise portions of the potentiometers is utilized solely to prevent overriding. If desired, however, the portion of the potentiometer resistance utilized to prevent overriding may be located entirely adjacent the extreme counter-clockwise terminal. Furthermore, if the potentiometers utilized are of linear characteristics, it is immaterial whether these inactive resistances appearing at the beginning and the end of the tuning path of each of the arms 14a through 17a are one half or any other portion of the total inactive resistance. A purpose of introducing these unused portions of the total potentiometer resistance is to keep the arms 14a through 17a far enough away from the extreme ends of each of the potentiometers 14 through 17, respectively, so as to prevent overriding of the potentiometer terminals. Overriding of the potentiometer terminals would upset the calibration at the ends of the scales.

In addition, it is desirable that the unused portions of the potentiometer resistance adjacent the extreme counter-clockwise position be available for measurement as a check against the overriding of the end terminals and also as a check on the condition of the ganging of the potentiometers 14 through 17.

If other than straight line resistance potentiometers or straight line capacitive tuning condensers are used, care must be taken that the unused capacity or resistance at the extreme high frequency setting, i. e., the lowest capacity or resistance end, are exactly alike in value and of equal increment. In other words, if specially tapered potentiometers or specially shaped condensers are used for tuning, they must be accurately ganged and aligned and should remain so during the life of the system. If the ganging or alignment of these tuning units is changed, the scale calibration will be materially affected.

Connected in series with each of the potentiometers 14 through 17 are fixed impedance elements, such as resistors 14b through 17b, respectively, and variable resistors 14c through 17c, respectively. The variable resistors 14c through 17c are equivalent in their nominal resistance values. They function as equalizing resistors in the tuning circuits.

For the purposes of convenience, the term "potentiometer resistance circuit" will be understood to include any portion of any of the potentiometers 14 through 17 that is momentarily or permanently in the circuit for tuning purposes, plus its accompanying fixed resistor, i. e., 14b through 17b, and its accompanying variable resistor, i. e., 14c through 17c.

As illustrated in Fig. 2, each potentiometer resistance circuit is connected across separate terminals, such as 14e, 14f; 15e, 15f; 16e, 16f; and 17e, 17f, respectively, on a terminal strip 23. For the purpose of convenience in testing and checking the circuit, the movable arms 14a through 17a are individually and directly connected to individual open terminals 14g through 17g, respectively, on said terminal strip 23.

The terminal strip 23 provides a convenient arrangement of measuring the fixed resistance for each of the potentiometer resistance circuits 14 through 17, not used in the variable tuning. This is accomplished by rotating the potentiometer arms 14a through 17a to their extreme counter-clockwise tuning position by means of the tuning dial 22. A resistance measurement between terminals 14e and 14f through 17e and 17f serves as a check on the equal fixed resistance for all potentiometer circuits 14 through 17, equalization being accomplished for each circuit by the equalizers 14c through 17c.

This terminal arrangement also provides a convenient means of checking of the alignment of the potentiometers 14 through 17, this alignment being one hundred per cent true when the resistance measured for all four potentiometers is equal in value as measured between the terminals 14e and 14g through 17e and 17g.

However, this last mentioned condition is not a necessary requirement when potentiometers of linear characteristics are utilized. When potentiometers of linear characteristics are utilized, an equal amount of travel of the potentiometer arms 14a through 17a will add the same amount of resistance to the fixed resistance already present in the circuit.

Potentiometers 14 through 17 are connected via their respective e and f terminals on the terminal strip 23 to four decks, 24 through 27, of a six-deck ten-position or ten-circuit selector switch. For the purpose of convenience, the ten switch points on each of the decks will be lettered from a to j, inclusive, and when referring to any specific switch point on any of the decks, the numeral will refer to the deck and the following letter to the specific switch point on the deck.

The switch points on the decks 24 and 26 are connected in exactly the same manner. The switch points on the decks 25 and 27 are connected in the same manner. The decks 24 and 25 function in conjunction with the potentiometer circuits 16 and 17, and the decks 26 and 27 function in conjunction with the potentiometers 14 and 15.

The remaining two decks of the six-deck selector switch are numbered 28 and 29. The switch points again will be referred to by the letters *a* through *j*, inclusive, and when referring to any specific switch point, the numerical designation will refer to the deck and the letter following to the specific point in said deck. The decks 28 and 29 are identically wired and are connected, as shown, to two sets of four condensers, 30 through 33, and 34 through 37, respectively. The condensers 30 through 33 and the condensers 34 through 37 are the tuning condensers, and condenser 30 is equal in capacity value to condenser 34. Condenser 31 is equal in capacity value to condenser 35, condenser 32 is equal in capacity value to condenser 36, and condenser 33 is equal in capacity value to condenser 37.

The movable arms of the six-deck selector switch will be identified by the letter *k* in each of the decks, and when any specific movable arm is referred to, the deck numeral will be followed by the letter *k*. The switch arms 24*k* through 29*k* are all ganged on a common switching shaft, which may be manually operated by a knob or suitable handle on the front of the tuning unit housing. In rotating this common shaft, the switch arms 24*k* through 29*k* are rotated in alignment, so that, for example, the arms 24*k* through 29*k* will all be in contact with points 24*a* through 29*a*, respectively. In a similar manner, when the movable arm 24*k* is in contact with the point 24*d*, the remaining movable arms 25*k* through 29*k* will be in contact with the points 25*d* through 29*d*, respectively. In order to prevent the cessation of oscillation when switching from one switch point to another, it is preferred that the switching arms 24*k* through 29*k* be of the "shorting" type, i. e., the type that contacts or engages the next succeeding switch point before breaking contact with the preceding one.

Examining the connections shown in Fig. 2 between the potentiometers 14 through 17 and their associated resistances, the decks 24 through 29 of the six-deck ten-point selector switch, and the condensers 30 through 33 and 34 through 37, it is seen that when the switch arms 24*k* through 29*k* are in contact with the switch point *a* on the decks 24 through 29, the potentiometer resistance circuits, including potentiometers 16 and 17, are connected in series with each other. The potentiometer resistance circuits 14 and 15 are also connected in series via the decks 26 and 27, and condensers 30 and 34 are included in the tuning circuit.

The above series arrangement is established whenever the movable switch arms 24*k* through 29*k* are in contact with the switch points 24*a* through 29*a*, 24*d* through 29*d*, and 24*g* through 29*g*.

When the switching arms 24*k* through 29*k* are in contact with the points 24*b* through 29*b*, the potentiometer resistance circuits 14 and 16 are engaged in the circuit and the potentiometer resistance circuits, including potentiometers 15 and 17, are open. This single circuit connection is formed whenever the switch arms 24*k* through 29*k* are in contact with the switch points 24*b* through 29*b*, 24*e* through 29*e*, and 24*h* through 29*h*.

When the switching arms 24*k* through 29*k* are in contact with the points 24*c* through 29*c*, the potentiometer resistance circuits 16 and 17 are paralleled via the decks 24 and 25, as are the potentiometer resistance circuits 14 and 15 via the decks 26 and 27. This parallel connection is formed whenever the switch arms 24*k* through 29*k* are in contact with the switch points 24*c* through 29*c*, or 24*e* through 29*e*, or 24*i* through 29*i*.

The tuning condensers are introduced into the circuit via the switch decks 28 and 29. When the movable arms 24*k* through 29*k* are on switch points *a*, *b* or *c*, condensers 30 and 34 are included in the circuit. When the movable arms 24*k* through 29*k* are on switch points *d*, *e* or *f*, condensers 31 and 35 are included in the circuit, and when the movable arms 24*k* to 29*k* are in contact with the switch points *g*, *h* or *i*, condensers 32 and 36 are included in the circuit.

In any one of the above examples, the effective tuning resistance for any position of the potentiometer arms 14*a* through 17*a* will appear between the movable switching arms governing the switching of the respective circuits. For example, for the potentiometers 16 and 17 it will appear between the movable arms 24*k* and 25*k* for the switch decks 24 and 25, and for the potentiometers 14 and 15 it will appear between the rotating switching arms 26*k* and 27*k* for the switching decks 26 and 27. The above switching arrangement provides that the effective tuning resistance in the *a*, *d* and *g* positions of the six-deck selector switch is always twice the resistance for that of the *b*, *e* and *h* positions, and four times the resistance for that of the *c*, *f* and *i* positions. The groups of three switching positions, i. e., *a*, *d* and *g*; *b*, *e* and *h*; and *c*, *f* and *i*, form tuning cycles in which the potentiometer circuits 16 and 17 or 14 and 15 appear as a series circuit, as a single unit, or as a parallel circuit, respectively, for the potentiometers involved.

The points in the switch deck 28 are connected so that when the movable arm 28*k* is in the *a*, *b* or *c* position, the condenser 30 is placed in series with potentiometer resistance circuits 16 and 17, as described above. The switch deck 29 is similarly connected, in that the condenser 34 is placed in parallel to the arrangements of the potentiometer resistance circuits 14 and 15, as determined by the *a*, *b* and *c* switching positions.

Furthermore, the combination of the condenser 30 with the potentiometers 16 and 17 in any one of the three switching arrangements, i. e., series, single unit or parallel, will be a series combination. Condenser 34 will be placed in parallel at the same time. A lead 38 is brought out to serve as a connector to the amplifier feed back, so labeled on the drawing. Another lead 39 is brought out to serve as a connector to the oscillator grid, and is so labeled on the drawing. These leads, 38 and 39, are utilized to join the bandspread tuning unit to the amplifier feedback lead and the oscillator grid lead of an amplifier and power supply system, such as that suitably shown schematically in Fig. 1.

A careful selection of the values of the fixed resistors 14*b* through 17*b* and the equalizing variable resistors 14*c* through 17*c* shows that the fixed resistance of each of the potentiometer resistance circuits can be made equal by adjusting the variable resistors 14c through 17c. Furthermore, this fixed resistance present in each of the potentiometer resistance circuits should be made to represent two thirds of the resistance of the variable portion of each of the potentiometers 14 through 17. Stated in other words, the tuning resistance for any one of the three possible switching arrangements, i. e., series, single circuit, or parallel, at the minimum frequency position is 2½ times as high as at the maximum frequency readings. The swing between the frequency readings is governed by the maximum and minimum resistance settings of the potentiometer arms 14a through 17a.

For example, if the frequency for the first selector switch position, i. e., *a*, is preselected to be ten cycles per second, then the *a* position on the six-deck selector switch will cover a range from 1 to 2.5 times the minimum frequency. This results in the highest frequency reading on a subscale covered by the switch position *a* to be 2.5 times the minimum frequency reading, or 25. This scale will be designated as scale 40 on Fig. 3.

If the movable arms 24*k* through 29*k* are moved to the next switch position, i. e., the *b* switch point, the entire available tuning resistance will be halved for the entire tuning range and the frequency covered will now be 20 to 50 cycles per second. This range of frequencies is covered on scale 41 on Fig. 3.

If the movable arms 24*k* to 29*k* are advanced to the next successive switch point, i. e., switch point *c*, the tuning resistance is again halved and the frequency range covered is from 40 to 100 cycles per second. This frequency range is set forth on scale 42 on Fig. 3.

The above set of switch points, i. e., *a*, *b* and *c*, presents a complete tuning cycle in three steps and covers a range of frequencies from 10 to 100 cycles. The coverage of this frequency band on the three separate subscales in effect provides a greatly enlarged scale from which accurate measurements may be directly taken.

The above three-step tuning cycle utilized condensers 30 and 34 in the tuning circuits. To cover a range of frequencies ten times greater than the range covered on the first three positions of the six-deck selector switch, the condensers 30 and 34 must be replaced by condensers having $\frac{1}{10}$ of their capacitive value. To accomplish this result, the condensers 31 and 35 are connected into the tuning system when the movable arms 24*k* through 29*k* are in the *d*, *e* and *f* positions. This condenser changing is automatically performed by the connections on the switch decks 28 and 29. The frequency coverage within this second frequency band is obtained in a manner similar to that described above, except that switch points *d*, *e* and *f* are utilized instead of switch points *a*, *b* and *c*.

To cover a range of frequencies a hundred times greater than the range covered on the first three positions of the six-deck selector switch, the condensers 32 and 36 must be introduced into the circuit. Condensers 32 and 36 have $^1/_{100}$ the capacitive value of condensers 30 and 34. Condensers 32 and 36 are connected into the tuning system when the movable arms 24*k* through 29*k* are in the *g*, *h* and *i* positions. The frequency coverage within this third frequency band is obtained in a manner similar to that described above, except that switch points *g*, *h* and *i* are utilized instead of switch points *a*, *b* and *c*.

At the completion of the three switching cycles, namely, *a*, *b*, *c*; *d*, *e*, *f*; and *g*, *h*, *i*, a frequency spectrum of from 10 to 10,000 cycles per second has been covered. The next frequency band is from 10,000 to 25,000 cycles per second, which would normally be read on the scale 40, to which a multiplier of 1,000 or one kilocycle is utilized for direct reading. To cover the frequency spectrum from 10,000 to 25,000 cycles per second, the switch points *j* on decks 24 through 27 are joined to the points *i*. The operation of the circuits when the movable arms 24*k* through 27*k* are in contact with the points 24*i* through 27*i* is equivalent to that explained above when the movable arms 24*k* through 27*k* are in contact with the points 24*c* through 27*c*. Hence, the arms 24*k* through 27*k*, for the frequency band from 10,000 to 25,000 cycles per second, are connected to the points 24*j* through 27*j*, which is equivalent to a connection between 24*i* through 27*i*, which makes the tuning resistance covered four times smaller than is determined by the original series resistance. Consequently, to make the scale 40 read accurately for the range of 10,000 to 25,000 cycles per second, the condensers 33 and 37 are, therefore, not $\frac{1}{10}$ of condensers 32 and 36, but are $\frac{4}{10}$ of the capacity of condensers 32 and 36. Condensers 33 and 37 are introduced into the circuit when the movable switch arms 28*k* and 29*k* are in contact with switch points 28*j* and 29*j*. Making these condensers, i. e., 33 and 37, as high in value as possible, in this manner, is advantageous, since a high ratio of tuning capacity to circuit wiring capacity and to stray capacity to ground can be more precisely adjusted and more easily stabilized than if this ratio were low.

In the presently preferred embodiment of the invention, a six-deck selector switch has been shown. However, this switch could be replaced with a simpler unit of the drum or commutator type especially manufactured for this purpose. The use of this type of switch will avoid much of the outside wiring, as shown between the switch points for the selector switch arrangement of Fig. 2.

Figure 3:
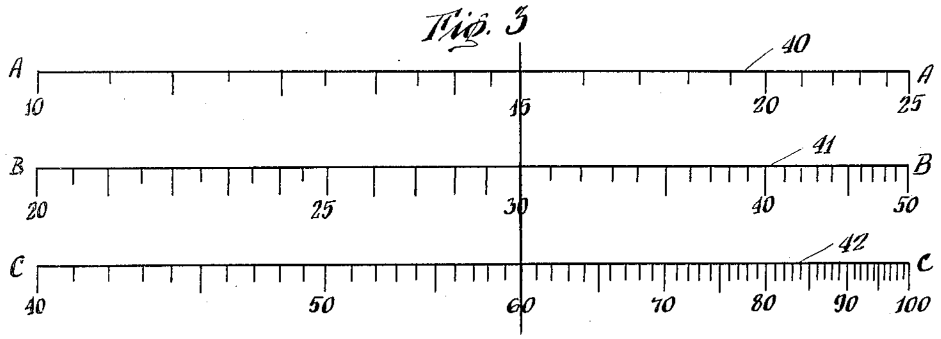
Fig. 3 is a representation of the enlarged decade tuning scale showing three subscales.

Referring to Fig. 3, it will be noted that the scale 40 begins with the number 10 and the scale 42 ends with 100. There is no overlapping for changing from one multiplier to the next as applied to these two scales. If a slight overlap is desired between the scales 40 and 42, it may be obtained by selectively choosing a ratio between the maximum and minimum variable tuning impedances slightly higher than the 2.5 value that was used in designing the scales as shown.

The decade scale, divided into three subscales, as shown in Fig. 3, may be predesigned from a calculated tuning curve for a complete bandspread tuning system, as described above, without the introduction of appreciable tracking error on the scales. This is generally true, except perhaps on the lowest and highest scales, where increased circuit impedance and phase shift, respectively, may show their influence. However, in the case of the latter scale, which has its own independent condenser switch points, i. e., 28*j* and 29*j*, and its own multiplier condensers, 33 and 37, frequency correction may be more easily introduced on such isolated scale of limited range than would be possible if a greater ratio than 1 to 2.5 between the lowest and highest frequency would be covered by the scale, and in which the affected portion at the higher end of the spectrum can not be isolated from the rest of the tuning range.

In addition, if a straight line is drawn vertically across the scales 40, 41 and 42, as shown in Fig. 3, the readings on the scale 40 or the "A" scale will always be one half of the readings on the scale 41 or the "B" scale, which in turn will be one half the readings on the scale 42 or the "C" scale. Therefore, if the tuning dial pointer is set at 15 cycles per second on the lowest scale, i. e., scale 40, as shown on Fig. 3, then by merely turning the movable arms 24k through 29k over the ten switch points with their corresponding multipliers, ten frequencies can be read without the necessity of resetting the pointer. These ten frequencies are more conveniently, quickly and decidedly more accurately obtained than if retuning by dial setting would have been required.

If desired, the three scales, as shown in Fig. 3, may be reduced to a single scale. This scale would be the intermediate scale 41, to which a divider of one half may be applied to arrive at the values of scale 40, and to which a multiplier of 2 may be applied to reach the values of scale 42.

Figure 5A:
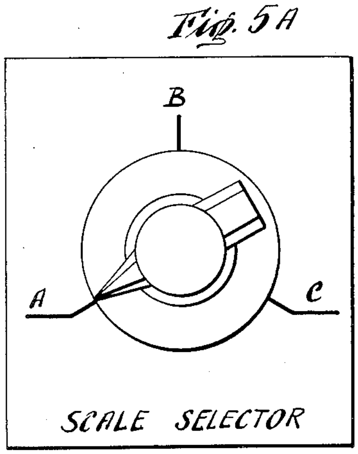
Figs. 5A and 5B are alternative marking plates for an alternative switching arrangement.
Figure 5B:
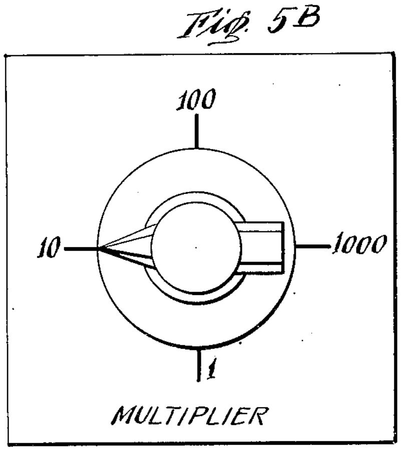

The single six-deck selector switch illustrated as the presently preferred embodiment of the invention may be replaced by two separate selector switches. One of these switches would replace decks 24 through 27, and the other switch would replace decks 28 and 29. The first mentioned switch, in this case, would control the introduction of the resistance into the tuning circuit, and the second mentioned switch could be utilized for introducing the required condensers into the tuning circuit. If two separate switches were utilized to replace the present six-deck selector switch, an arrangement similar to that illustrated in Figs. 5A and 5B would be utilized. Fig. 5A shows the marking plate for a switch utilized to replace the decks 24 through 27, and is designated the "Scale selector." Fig. 5B illustrates a type of marking plate which would be utilized for the second switch, i. e., the one that replaces decks 28 and 29 and may be designated as the "Multiplier switch."

Figure 4:
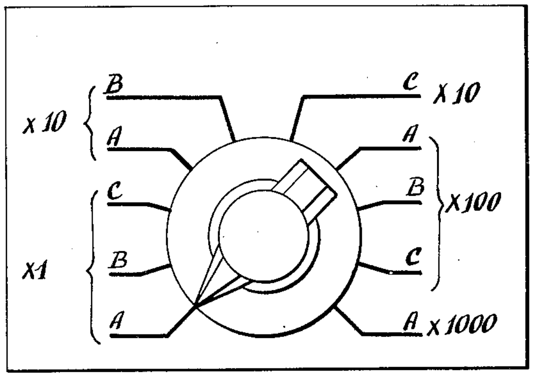
Fig. 4 is a represenation of an external marking plate for the presently preferred switching arrangement.

Fig. 4 illustrates a composite marking plate, which is utilized in the presently preferred embodiment of the invention incorporating the six-deck selector switch, as illustrated in the drawings.

It should be noted that the embodiment of the invention illustrated in the drawings utilizes a bandspread tuning circuit composed of a series resonant circuit and a parallel resonant circuit. However, the invention is equally applicable to a tuning circuit made up of a single resonant circuit or of a plurality of resonant circuits.

Having thus described my invention, I claim:

1. A bandspread tuning circuit, comprising, first and second tunable impedance members connected in series with an intermediate first fixed impedance member of opposing electrical characteristics, a second fixed impedance member having electrical characteristics similar to those of said first fixed impedance member shunted across said second tunable impedance member, said first and second fixed impedance members each comprising a plurality of fixed impedances having predetermined values, said last mentioned impedances being selectively adapted for individual connection into said tuning circuit, switching means for effecting the selected connection of said last mentioned impedances, said first and second tunable impedance members each comprising a pair of equal tuning impedance circuits, said tuning impedance circuits each including a variable impedance element connected in series with a fixed impedance element of similar electrical characteristics, each of said variable impedance elements and each of said fixed impedance elements having predetermined values being such that the total impedance of each of said tuning impedance circuits may be varied through an impedance ratio of one to approximately 2.5, each pair of tuning impedance circuits being selectively adapted for connection of one alone, for connection of both in series, and for connection of both in parallel, and second switching means for effecting any selected one of the aforesaid connections to constitute said first and second tunable impedance members from said pairs of tuning impedance circuits.

2. A band spread resonant tuning circuit, comprising, first and second tunable impedance members connected in series with an intermediate first fixed impedance member of opposing electrical characteristics, a second fixed impedance member having electrical characteristics similar to those of said first fixed impedance member shunted across said second tunable impedance member, said first and second fixed impedance members each comprising a plurality of fixed impedances having predetermined values, said last mentioned impedances being selectively adapted for individual connection into said tuning circuit, switching means for effecting the selected connection of said last mentioned impedances so as to maintain the impedance value of said first and second fixed impedance members equal, said first and second tunable impedance members each comprising a pair of equal tuning impedance circuits, said tuning impedance circuits each including a variable impedance element connected in series with a fixed impedance element of similar electrical characteristics, each of said variable impedance elements and each of said fixed impedance elements having predetermined values being such that the total impedance of each of said tuning impedance circuits may be varied through a predetermined impedance ratio for presenting the frequency coverage of the circuit on a decade type scale, said variable impedance elements in said tuning impedance circuits having similar impedance characteristics and values, each pair of said tuning impedance circuits being selectively adapted for connection of one of said tuning impedance circuits making up each of said pairs alone, for connection of both in series, and for connection of both in parallel, and second switching means for effecting any selected one of the aforesaid connections to constitute said first and second tunable impedance members from said pairs of tuning impedance circuits.

3. A bandspread resonant tuning circuit, comprising, first and second variable resistance tuning members connected in series with an intermediate first fixed capacitive member, a second fixed capacitive member shunted across said second variable resistance tuning member, said first and second fixed capacitive members each comprising a plurality of fixed condensers having predetermined values, said condensers being selectively adapted for individual connection into said tuning circuit, switching means for effecting the selected connection of said condensers, said first and second variable resistance tuning members each comprising a pair of tuning resistance circuits, said tuning resistance circuits each including a potentiometer connected in series with a resistor, said resistors and said potentiometers having predetermined values so that the total resistance of each of said tuning resistance circuits may be varied through a resistance ratio of one to approximately 2.5, each of said tuning resistance circuits being selectively adapted for connection of one alone, for connection of each of said pairs in series, and for connection of each of said pairs in parallel, and second switching means for effecting any selected one of the aforesaid connections to constitute said first and second variable resistance tuning members from said pairs of tuning resistance circuits.

4. A bandspread resonant tuning circuit for audio oscillators in which the audio frequency range is covered by a decade scale composed of three subscales, comprising, first and second variable resistance tuning members connected in series with an intermediate first fixed capacitive member, a second fixed capacitive member shunted across said second variable resistance tuning member, said first and second fixed capacitive members each comprising a plurality of fixed condensers having predetermined values, said condensers being selectively adapted for individual connection into said tuning circuit, switching means for effecting the selected connection of said condensers whereby the frequency ranges covered by said decade scale are changed, said first and second variable resistance tuning members each comprising a pair of tuning resistance circuits, said tuning resistance circuits each including a potentiometer connected in series with a resistor, said resistors and potentiometers having predetermined values so that the total resistance of each of said tuning resistance circuits may be varied through a resistance ratio of one to approximately 2.5, whereby the numerical limits of said subscales are established, each of said tuning resistance circuits being selectively adapted for connection of one alone, for connection of each of said pairs in series, and for connection of each of said pairs in parallel and second switching means for effecting any selected one of the aforesaid connections to constitute said first and second variable resistance tuning members from said pairs of tuning resistance circuits whereby a frequency range is covered on said three subscales.

5. A bandspread tuning circuit in which the frequency range is presented on a decade type scale composed of three subscales, comprising, a first variable resistance element connected in series with a capacitive tuning element and a second variable resistance element, a second capacitive tuning element connected in parallel with said second variable resistance element; said first variable resistance element including, a pair of equivalent linear potentiometers each in series with a fixed resistance of predetermined value so that the resistance ratio of said series circuit may be varied through the resistance ratio of 1 to 2.5, first switching means for selectively and sequentially connecting in the tuning circuit said pair of potentiometers and their respective series resistances in series, for only connecting one of said pair of potentiometers and its respective series resistance, and for connecting said pair of potentiometers and their respective series resistances in parallel; said second variable resistance element including, a second pair of equivalent linear potentiometers each in series with a fixed resistance of said predetermined value, second switching means coacting with said first switching means for selectively and sequentially including in the tuning circuit said second pair of potentiometers and their respective series resistances in series, for only connecting one of said second pair of potentiometers and its respective series resistance, and for connecting said second pair of potentiometers and their respective series resistances in parallel; and third switching means for selectively introducing capacitors of equal predetermined value as said first and second capacitive tuning elements.

6. A bandspread resonant tuning circuit, comprising, a tunable impedance member, a fixed impedance member having opposing electrical characteristics connected to said tunable impedance member, said fixed impedance member comprising a plurality of fixed impedances having predetermined values, said last mentioned impedances being selectively adapted for individual connection into said tuning circuit, switching means for effecting the selected connection of said last mentioned impedances, said tunable impedance member comprising a pair of equal tuning impedance circuits, said tuning impedance circuits each including a variable impedance element connected in series with a fixed impedance element of similar electrical characteristics, each of said variable impedance elements and each of said fixed impedance elements having predetermined values being such that the total impedance of each of said tuning impedance circuits may be varied through a predetermined impedance ratio of 1 to 2.5, each of said pair of tuning impedance circuits being selectively adapted for connection of one of said pair of tuning impedance circuits alone, for connection of both in series, and for connection of both in parallel, and second switching means for effecting any selected one of the aforesaid connections to constitute said tunable impedance member.

CHRISTIAN F. WEILAND.

No references cited.